United States Patent [19]

Imai et al.

[11] Patent Number: 4,959,872
[45] Date of Patent: Sep. 25, 1990

[54] AUTOMATIC FREQUENCY CONTROL APPARATUS FOR FM RECEIVERS

[75] Inventors: Tadashi Imai; Shinobu Okitu, both of Saitama, Japan

[73] Assignee: Kabushiki Kaisha Toshiba, Kanagawa, Japan

[21] Appl. No.: 370,001

[22] Filed: Jun. 22, 1989

[30] Foreign Application Priority Data

Jun. 23, 1988 [JP] Japan .................. 63-156404

[51] Int. Cl.$^5$ ............................ H04B 11/16
[52] U.S. Cl. .................. 455/164; 455/182; 455/183; 455/192
[58] Field of Search ............ 455/164, 182, 183, 192, 455/207–209, 260, 264, 315, 316; 375/97, 98, 99; 331/1 R, 11, 22, 31

[56] References Cited

U.S. PATENT DOCUMENTS

| | | | |
|---|---|---|---|
| 3,922,609 | 11/1975 | Grohmann | 455/192 |
| 4,123,716 | 10/1978 | Borg | 455/192 |
| 4,245,351 | 1/1981 | Tults | 455/182 |
| 4,498,191 | 2/1985 | Rogers | 455/182 |
| 4,601,060 | 7/1986 | Wine | 455/192 |
| 4,805,230 | 2/1989 | Tanaka | 455/182 |
| 4,819,069 | 4/1989 | Tanaka | 455/192 |

Primary Examiner—Reinhard J. Eisenzopf
Assistant Examiner—Andrew Faile
Attorney, Agent, or Firm—Finnegan, Henderson, Farabow, Garrett and Dunner

[57] ABSTRACT

An automatic frequency control apparatus for an FM receiver. The apparatus includes a local oscillator for generating a local oscillation signal which frequency is controlled in response to a received input FM signal, a frequency converter for convertig the input FM signal into an IF signal having a center frequency in response to the local oscillation signal from the local oscillator, an FM demodulater for demodulating the IF signal into a demodulated output having AC and DC components, a low pass filter for removing the AC component from the demodulated output, a first A/D converter for converting the remaining DC component of the demodulated output to a digital tuning signal, a reference voltage source for supplying a reference voltage corresponding to the center frequency of the IF signal, a second A/D converter for converting the reference voltage from the referrence voltage source to a digital reference voltage signal, and a microcomputer for calculating the demodulation sensibility of the digital tuning signal from the digital tuning signal and the digital reference voltage signal and for generating an AFT data signal in response to the demodulation sensibility of the digital tuning signal for controlling the frequency of the local oscillation signal.

4 Claims, 9 Drawing Sheets

AUTOMATIC FREQUENCY CONTROL APPARATUS FOR FM RECEIVERS

FIELD OF THE INVENTION

The present invention relates to an FM (Frequency Modulation) receiver, and more particularly to an automatic frequency control apparatus for a local oscillation signal of an FM receiver.

DESCRIPTION OF THE PRIOR ART

Conventional FM signal receiving circuits have a microcomputer and a PLL (Phase Lock Loop) circuit in their tuning systems. The microcomputer is provided for controlling a local oscillation signal generated from the PLL circuit. The microcomputer can also carry out additional functions, such as remote control tuning, digital channel tuning data display, etc.

Recently, satellite broadcasting has been utilized. The satellite broadcasting uses an FM broadcasting signal. The FM broadcasting signal used in the satellite broadcasting has a carrier wave in the SHF (Super High Frequency) band. Thus, a satellite receiver for receiving the satellite broadcasting has an FM signal receiving circuit provided with a microcomputer and a PLL circuit.

In such an FM signal receiving circuit for the satellite receiver, an SHF signal transmitted from a satellite is converted to a low frequency signal by a double conversion system. According to the double conversion system, the SHF signal is firstly converted to a first IF (Intermediate Frequency) signal. Then, the first IF signal is converted to a second IF signal, i.e., the low frequency signal.

FIG. 1 shows a brief circuit diagram of a conventional FM signal receiving circuit for the satellite receiver. An input terminal 10 is provided for receiving an SHF signal transmitted from a satellite through an antenna (not shown). The SHF signal is applied to a first frequency converter 12. The first frequency converter 12 comprises a first mixer 14 and a first local osciallator 16. The first mixer 14 mixes the SHF signal with a first local osciallation signal generated from the first local oscillator 16.

The first local oscillation signal has a prescribed frequency which is lower than the frequency of the SHF signal. Thus, a first IF signal of about 1 GHz is obtained from the first mixer 14. Generally, the first frequency converter 12 is mounted in an outdoor unit near the antenna.

The first IF signal is applied to a second frequency converter 18 through a first IF amplifier 20. The second frequency converter 18 comprises a second mixer 22 and a second local osciallator 24. The second mixer 22 mixes the first IF signal with a second local oscillation signal generated from the second local oscillator 24. The second local oscillation signal has a frequency which is sufficiently lower than the frequency of the first IF signal frequency so that a second IF signal is obtained from the second mixer 22.

The second IF signal is applied to an FM decoder 26. The FM decoder 26 decodes the FM signal of the second IF signal. A demodulation signal of the conventional FM signal receiving circuit is obtained through an output terminal 28. The second frequency converter 18 and other decoding circuits ar usually mounted in an indoor unit. The outdoor unit and the indoor unit are coupled by a cable.

FIG. 2 shows details of the second local oscillator 24 of the second frequency converter 18 and the FM decoder 26. The second local oscillator 24 is constituted in a PLL circuit configuration. That is, the second local oscillator 24 comprises a VCO (Voltage Controlled Oscillator) 30, a frequency divider 32, a phase comparator 34, a reference signal generator 36 and a first LPF (Low Pass Filter) 38. The FM decoder 26 comprises an FM demodulator 40, a second LPF 42, a voltage level range detector 44, a reference voltage source 46 and a microcomputor 48.

In the second local oscillator 24, the VCO 30 generates the second local oscillation signal. The second local oscillation signal is applied to the frequency divider 32 as well as an output terminal 24a of the second local oscillator 24. The frequency divider 32 divides the frequency of the second local oscillation signal. A dividing data is supplied from the microcomputer 48 in the FM decoder 26, as described later.

An output of the frequency divider 32 is applied to the phase comparator 34. The reference signal oscillator 36 also supplies its reference oscillation signal to the phase comparator 34. The phase comparator 34 compares the divided signal and the reference oscillation signal. An error signal between the divided signal and the reference oscillation signal is applied to the VCO 30 through the first LPF 38. Thus, the VCO 30, the frequency divider 32, the phase comparator 34, and the first LPF 38 constitute a PLL circuit.

According to the PLL circuit configuration, the second local oscillation signal generated from the VCO 30 is stabilized at a high accuracy. Thus, the frequency Fvco of the second local oscillation signal can accurately follow an instantaneous frequency change of the first IF signal at a prescribed frequency difference. Further, the frequency division ratio of the frequency divider 32 is controlled by a channel tuning data supplied from the microcomputer 48. Then, the frequency Fvco of the second local oscillation signal is controlled by the microcomputer 48 in the FM decoder 26 to select a desired satellite broadcasting channel.

The FM demodulator 40 demodulates the FM signal of the second IF signal from the first frequency converter 14. The FM demodulated signal is led to the second LPF 42 as well as the output terminal 28. The output terminal 28 is connected to a television receiver, an FM receiver and the like.

The second LPF 42 eliminates AC components from the demodulation error of the FM demodulator 40. Thus, the DC component of the demodulation error is applied to the voltage level range detector 44. The DC component of the demodulation error (referred to as "demodulation error" hereinafter for simplicity) is proportional to a deviation of the second IF signal from the center frequency Fvco of the second local oscillator 24, i.e., the VCO 30.

The demodulation error is supplied to the voltage level range detector 44. A reference voltage Vref is also applied to the voltage level range detector 44 from the reference voltage source 46. The voltage level range detector 44 sets three voltage level ranges according to the reference voltage Vref and then detects the voltage range in which the demodulation error is found. The three voltage level ranges will be described later.

The demodulation error obtained from the second LPF 42 is applied to the voltage level range detector 44.

The reference voltage source 46 also supplies a reference voltage signal Vref to the voltage level range detector 44. The voltage level range detector 44 has two threshold voltages Vo+V1 and Vo−V1. Then, three voltage level ranges, i.e., a high voltage level range over the threshold voltage Vo+V1 and Vo−V1, a center voltage level range between the threshold voltages Vo+V1 and Vo−V1 and a low voltage level range below the threshold voltage Vo−V1 are set in the voltage level range detector 44.

The threshold voltages Vo+V1 and Vo−V1 are set in accordance with the reference voltage signal Vref, as described later. Then, the voltage level range detector 44 detects the voltage range in which the demodulation error is found.

The voltage level range detector 44 outputs a voltage level range data Dvlr expressing three status. One is the status when the demodulation error is within the center voltage level range. The other two are the status when the demodulation error is in the high or low voltage level range. The voltage level range data Dvlr is supplied to the microcomputer 48. The microcomputer 48 corrects the channel tuning data corresponding to a desired channel by the voltage level range data Dvlr. The corrected channel tuning data is supplied to the frequency divider 32 in the second local oscillator 24.

According to the conventional FM signal receiving circuit for the satellite receiver, the voltage level range data Dvlr obtained from the voltage level range detector 44 is digital data corresponding to a deviation of the second IF signal from the center frequency Fvco of the second local oscillation signal. The voltage level range data Dvlr takes a value (0, 0) if the deviation, i.e., the demodulation error is, within the center voltage level range. The voltage level range data Dvlr takes a value (1, 0) if the demodulation error is in the high voltage level range. The voltage level range data Dvlr takes a value (0, 1) if the demodulation error is in the low voltage level range.

The center voltage level ranges around Vo and this range is called a dead zone where no control of the second local oscillator 24 is carried out. The microcomputer 48 generates an AFT (Automatic Fine Tuning) data in response to the voltage level range data Dvlr. The AFT data is supplied to the second local oscillator 24 together with the channel tuning data.

There are two systems available for processing the AFT data. One is a system to independently control the division ratio of the frequency divider 32. Another is a system to superpose the AFT data over the channel tuning data. In the following, explanations will be made according to the latter system.

Referring now to FIG. 3, the detail of the voltage level range detector 44 will be described. In FIG. 3, the same symbols will be assigned to the portions corresponding to those in FIG. 2.

The reference voltage Vref is applied from the reference voltage source 46. Between the reference voltage source 46 and the reference potential source, three resistors 52, 54 and 56 are connected in series. Thus, two divided voltages Vo+V1 and Vo−V1 are obtained on two connection nodes of the resistors 52, 54 and 56. The first divided voltage Vo+V1 on the connecting node of the resistors 52 and 54 is supplied to the inversed terminal of a first operational amplifier 58, while the second divided voltage at the connection node of the resistors 54 and 56 is supplied to the non-inversed terminal of a second operational amplifier 60.

Further, the demodulation error voltage is applied through a terminal 44a connected to the second LPF 42. The demodulation error voltage is supplied to the non-inversed terminal of the first operational amplifier 58 and the inversed terminal of the second operational amplifier 60. Output signals of the first and second operational amplifiers 58 and 60 are led to the microcomputer 48 through output terminals 62 and 64.

In the voltage level range detector 44, the first and second divided voltages Vo+V1, Vo−V1 are used as high and low threshold values of a prescribed voltage range. Therefore, if the second IF signal is in a dead zone around the center frequency of the second local oscillation signal, potentials at the non-inversed terminals of the operational amplifiers 58 and 60 become lower than those at the inversion terminals, and Logic "0" signal is sent to the terminal 62 and 64.

If the second IF frequency is higher than the dead zone, the potential at the non-inversed terminal of the operational amplifier 58 becomes higher than that at the inversed terminal, sending a Logic "1" signal to the terminal 62, while the potential at the inversed terminal of the operational amplifier 60 becomes higher than that at the non-inversed terminals, thus sending a Logic "0" signal to the terminal 64.

If the second IF frequency is lower than the center frequency range, the potential at the inversed terminal of the operational amplifier 58 becomes higher than that at the non-inversed terminal, sending a Logic "0" signal to the terminal 62, while the potential at the non-inversed terminal of the operational amplifier 60 becomes higher than that at the inversed terminal, sending a Logic "1" signal to the terminal 64.

However, in the case of a circuit such as that shown in FIG. 3, the voltage range of the dead zone may change against the fixed width of the dead zone by the resistors 52, 54 and 56 due to fluctuation of demodulation sensibility in the FM demodulator 40. Further, as the output voltage of the FM demodulator 40 has a temperature drift, the demodulation error voltage has the temperature dependency and if the voltage range of the dead zone is exceeded, a malfunction of AFT appears and the center frequency of the second IF signal always has an unnecessary offset.

When levels of frequency may be judged more precisely by increasing the number of resistor circuits and operational amplifiers of the voltage level range detector 44, shown in FIG. 3. If the detuning degree from center frequency of the second IF signal is divided more finely by increasing the number of feedback data bits and control of the frequency division ratio is subdivided according to this division, more proper control becomes possible. However, the accuracy is proportional to the circuit scale and larger scale circuits are rather uneconomical. In addition, fluctuation of demodulation sensibility and effect of temperature drift are still unavoidable.

In the conventional FM signal receiving circuit for satellite receivers which selects a desired FM broadcasting signal by controlling local oscillation signals generated from the local oscillator, the dead zone of the AFT control for controlling the local oscillator is defined by detecting the voltage level range in which the feedback AFT signal Vaft for generating the AFT data is found. The feedback AFT signal Vaft is obtained by taking the demodulation error voltage showing the frequency difference between the IF signal and the center frequency of the local oscillation signal.

Therefore, the dead zone varies in response to the fluctuation of the demodulation sensibility of the FM signal receiving circuit. And the demodulation output voltage has a temperature drift or a dependency to a power supply voltage. Thus, a judgement whether the demodulation error voltage exceeds the dead zone or not becomes inaccurate. As a result, the IF signal has always uncertain offset. In addition, there is a problem that overrun occurs, resulting in AFT malfunction if the AFT control is excessive.

SUMMARY OF THE INVENTION

It is, therefore, an object of the present invention to provide an automatic frequency control apparatus of an FM receiver which can eliminate the above-mentioned problem and prevent malfunction of AFT operation by fluctuation in the demodulation sensibility and temperature dependency of demodulation output voltage.

In order to achieve the above objects, the automatic frequency control apparatus of the FM receiver according to one aspect of the present invention includes a local oscillator for generating a local oscillation signal which frequency is controlled in response to a received input FM signal, a frequency converter for converting the input FM signal into an IF signal having a center frequency in response to the local oscillation signal from the local oscillator, an FM demodulator for demodulating the IF signal into a demodulated output having AC and DC compoments, a low pass filter for removing the AC component from the demodulated output, a first A/D converter for converting the remaining DC component of the demodulated output to a digital tuning signal, a reference voltage source for supplying a reference voltage corresponding to the center frequency of the IF signal, a second A/D converter for converting the reference voltage from the reference voltage source to a digital reference voltage signal, and a microcomputer for calculating the demodulation sensibility of the digital tuning signal from the digital tuning signal and the digital reference voltage signal and for generating an AFT data signal in response to the demodulation sensibility of the digital tuning signal for controlling the frequency of the local oscillation signal.

According to the constitution described above, the demodulation sensibility is obtained from voltage change quantity corresponding to fixed frequency step. Further, it is possible to obtain a proper dead zone in the AFT control and the detuning degree from the center frequency on the basis of this demodulation sensibility. If detuning degree is large, frequency step width to be pulled toward the center frequency by AFT is made large, while if detuning degree is small. AFT change quantity making the step width small is controlled. Thus, such parameters as division of detuning degree, setting of the dead zone, etc. are all in proportion to demodulation sensibility, and AFT corresponding to fluctuation of demodulation sensibility is possible.

Further, as temperature coefficient and supply voltage dependency retained by demodulation output are added to DC voltage that decide center voltage, it is possible to cancel these characteristics relatively.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

For a better understanding of the present invention and many of the attendant advantages thereof, reference will now be made by way of example to the accompanying drawings, wherein.

DESCRIPTION OF THE PREFERRED EMBODIMENTS

Figure 1:
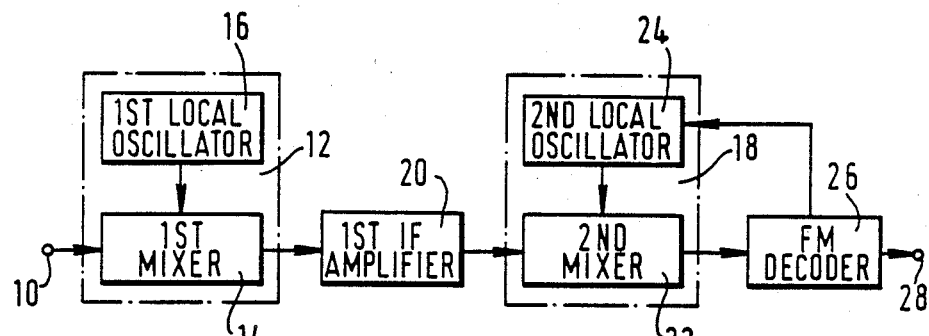
FIG. 1 shows a brief circuit diagram of a conventional FM signal receiving circuit for the satellite receiver.
Figure 3:
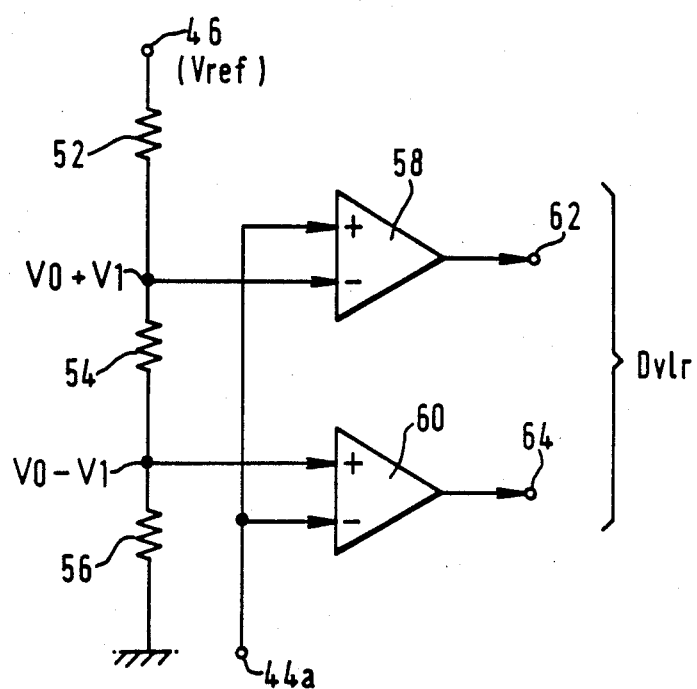
FIG. 3 is the circuit diagram showing a conventional voltage level range detector of FIG. 2.
Figure 2:
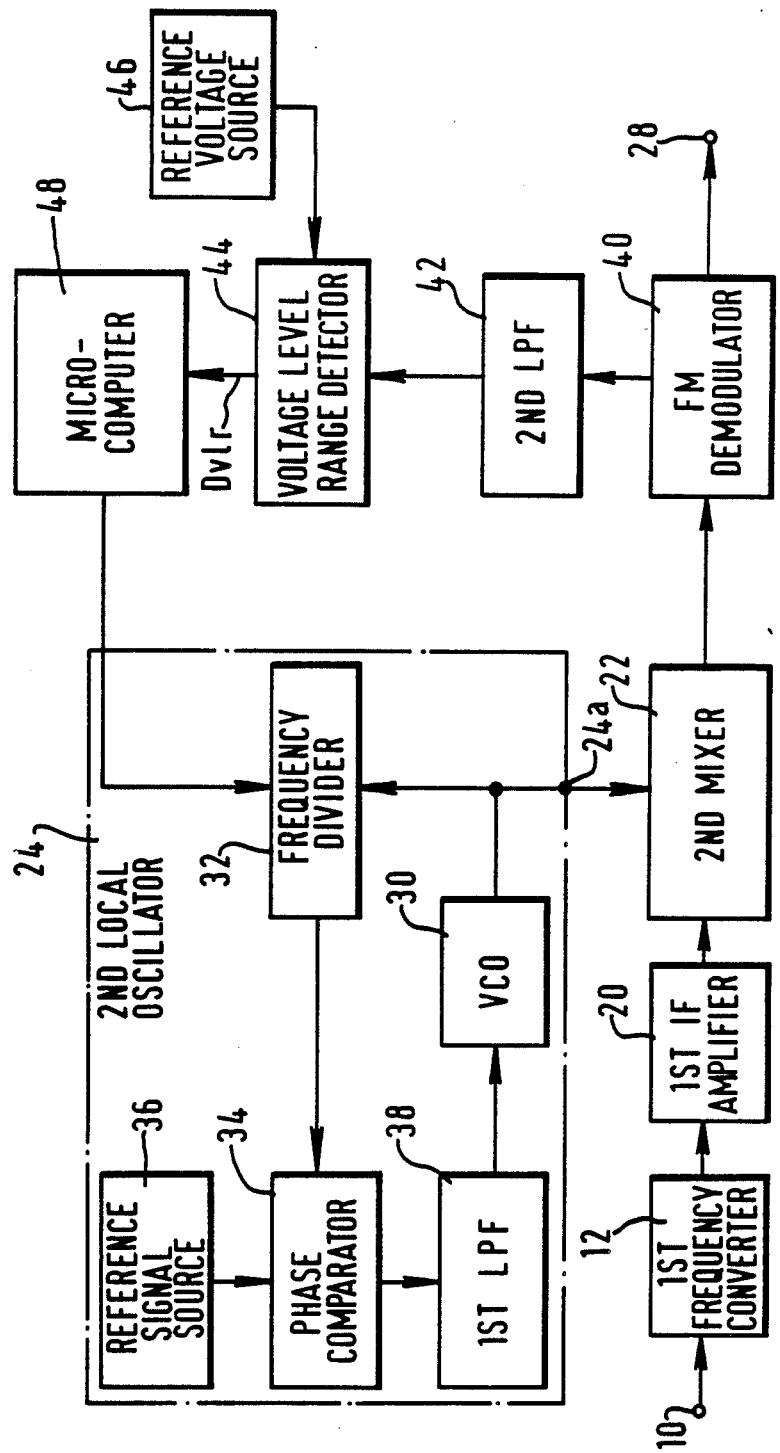
FIG. 2 is the block diagram showing the second local oscillator 24 and the FM decoder 26 of FIG. 1.

The present invention will be described in detail with reference to the FIGS. 4 through 14. Throughout the drawings, reference numerals or letters used in FIGS. 1 and 3 will be used to designate like or equivalent elements for simplicity of explanation.

Figure 4:
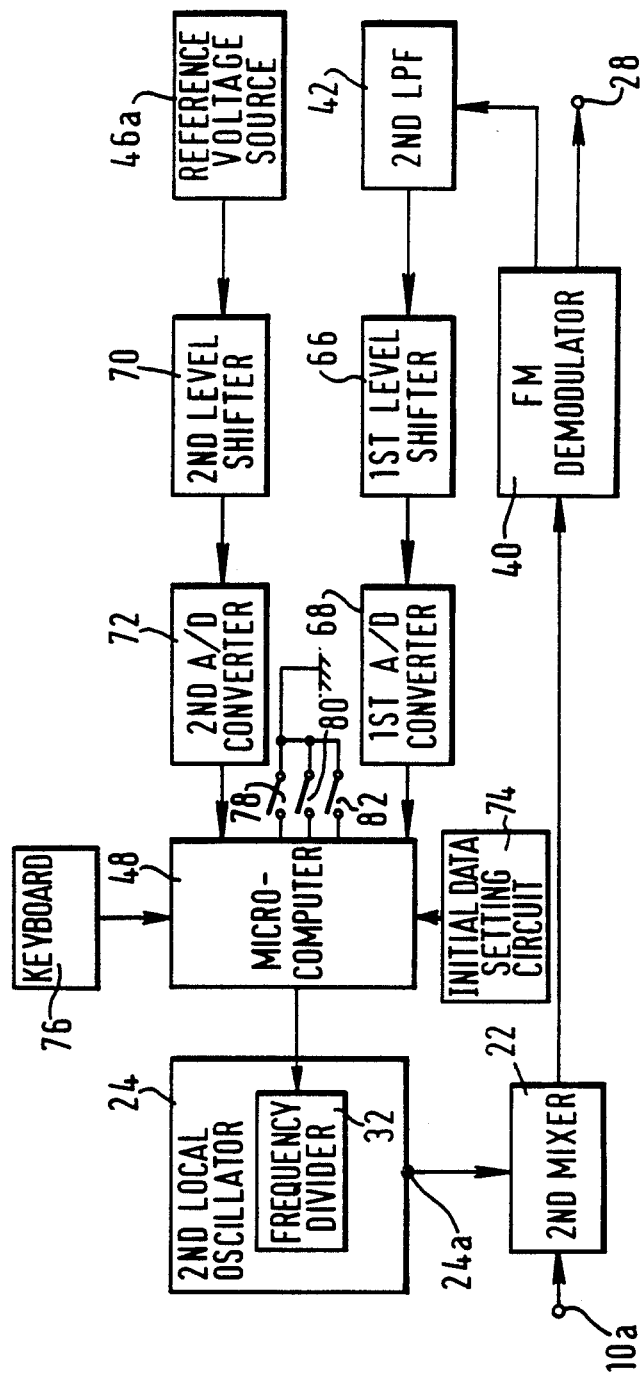
FIG. 4 is the block diagram showing the automatic frequency control apparatus of the FM receiver according to the present invention.

Referring now to FIG. 4, a first embodiment of the automatic frequency control apparatus for FM receivers according to the present invention will be described in detail.

The present invention is explained hereinafter by an embodiment applied to an SHF band FM receiver for receiving satellite broadcasting signals.

FIG. 4 is a block diagram showing an embodiment of a part of the SHF band FM receiver, i.e., a second frequency converter and an FM decoder of the SHF band FM receiver.

In FIG. 4, an input terminal 10a is provided for receiving a first IF signal. The first IF signal from the terminal 10a is sent to a second mixer 22 where the first IF signal is converted into an FM second IF signal. This second IF signal is supplied to an FM demodulator 40. The demodulation output from the FM demodulator 40 is led to an output terminal 28.

The FM demodulator 40 also supplies the demodulation output to a second LPF 42. The second LPF 42 eliminates AC components of the demodulation output. Thus, a demodulation error voltage Vde appears on the output end of the second LPF 42. The demodulation error voltage Vde is applied to a microcomputer 48 through a first level shifter 66 and a first A/D converter 68. The first A/D converter 68 converts the demodulation error voltage Vde from the second LPF 42 to a digital data Dde. Further, a reference voltage source 46a is provided for receiving a reference voltage Vref. The reference voltage Vref is set so as to correspond to the center frequency of the second IF signal. The reference voltage Vref is applied to the microcomputer 48 through a second level shifter 70 and a second A/D converter 72 which are in the construction similar to the first level shifter 66 and the first A/D converter 68. The second A/D converter 72 converts the reference voltage Vref from the second LPF 42 to a digital data Dref.

The first and second level shifters 66 and 70 match the demodulation error voltage Vde from the second LPF 42 to the reference voltage Vref, when the demodulation error voltage Vde is zero.

The microcomputer 48 executes calculation of a demodulation sensibility Sd based on the digital signals Dde and Dref from the first and second A/D converters 68 and 72. The microcomputer 48 further controls the second local oscillator 24 by generating an AFT data signal Daft based on the result of the calculation. The AFT data singal Daft controls the frequency division ratio of the frequency divider 32 in the second local oscillator 24.

The SHF band FM receiver of FIG. 4 further comprises an initial data setting circuit 74. The initial data setting circuit 74 is coupled to the microcomputer 48 for supplying the microcomputer 48 with an initial data Di. The initial data are supplied for a prescribed period when a main power source for activating the SHF band FM receiver has been firstly turned ON. The microcomputer 48 judges an expiration of transient state after the first turn ON of the main power source and then calculates the digital data Dde and Dref during the transient state based on the initial data Di.

The digital data Dde and Dref during the transient state are stored in a memory section of the initial data setting circuit 74. At a next turn ON of the main power source, the microcomputer 48 cancels errors of current AFT data caused in the transient state by the data previously stored in the memory. Thus, the current AFT data are automatically corrected. By the way, it is assumed that the microcomputer 48 is always backed up by a backup power source. Thus, the microcomputer 48 can immediately carry out the data correction from the start of the turn ON of the main power source. Steps of the data correction carried out by the microcomputer 48 will be described in detail later.

The SHF band FM receiver of FIG. 4 further comprises a keyboard 76 and a set of frequency offset keys 78, 80 and 82. The keyboard 76 and the set of frequency offset keys 78, 80 and 82 are also coupled to the microcomputer 48. The keyboard 76 includes channel selection keys by which users can designate a desired channel. Thus, the microcomputer 48 supplies the frequency divider 32 with a channel tuning data to set a reception of the desired channel in the SHF band FM receiver. The frequency offset keys 78, 80 and 82 are used for intentionally offsetting the center frequency of the second IF signal, as described later.

Figure 5:
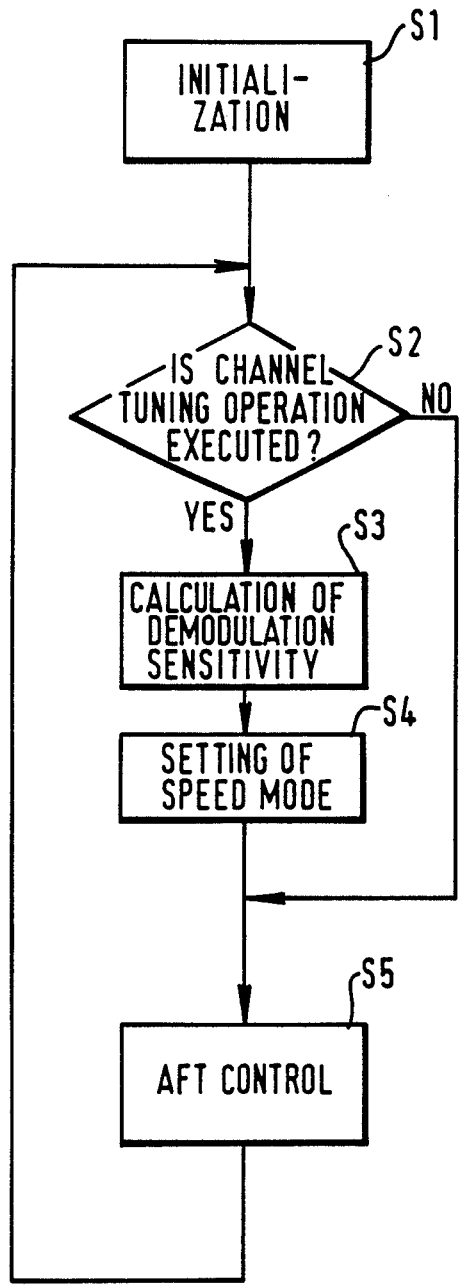
FIG. 5 is the flowchart showing the outline of operation of the present invention.
Figure 6:
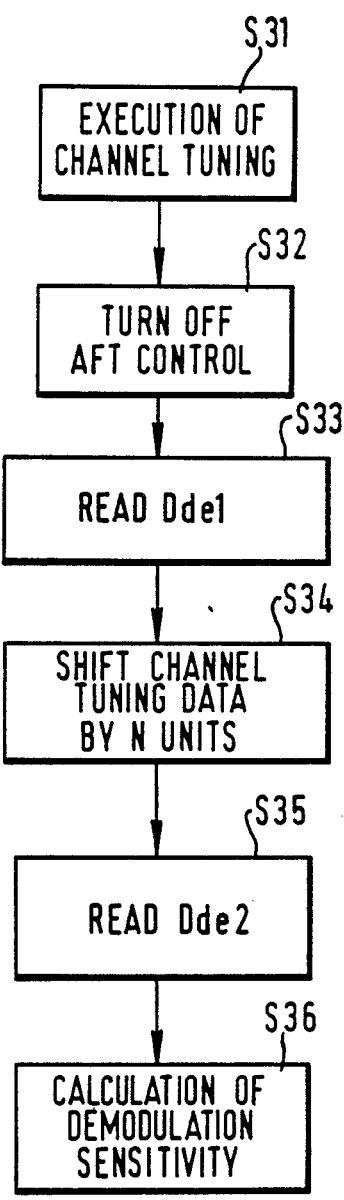
FIG. 6 is the flowchart showing the operating process of demodulation sensibility by present invention.
Figure 7:
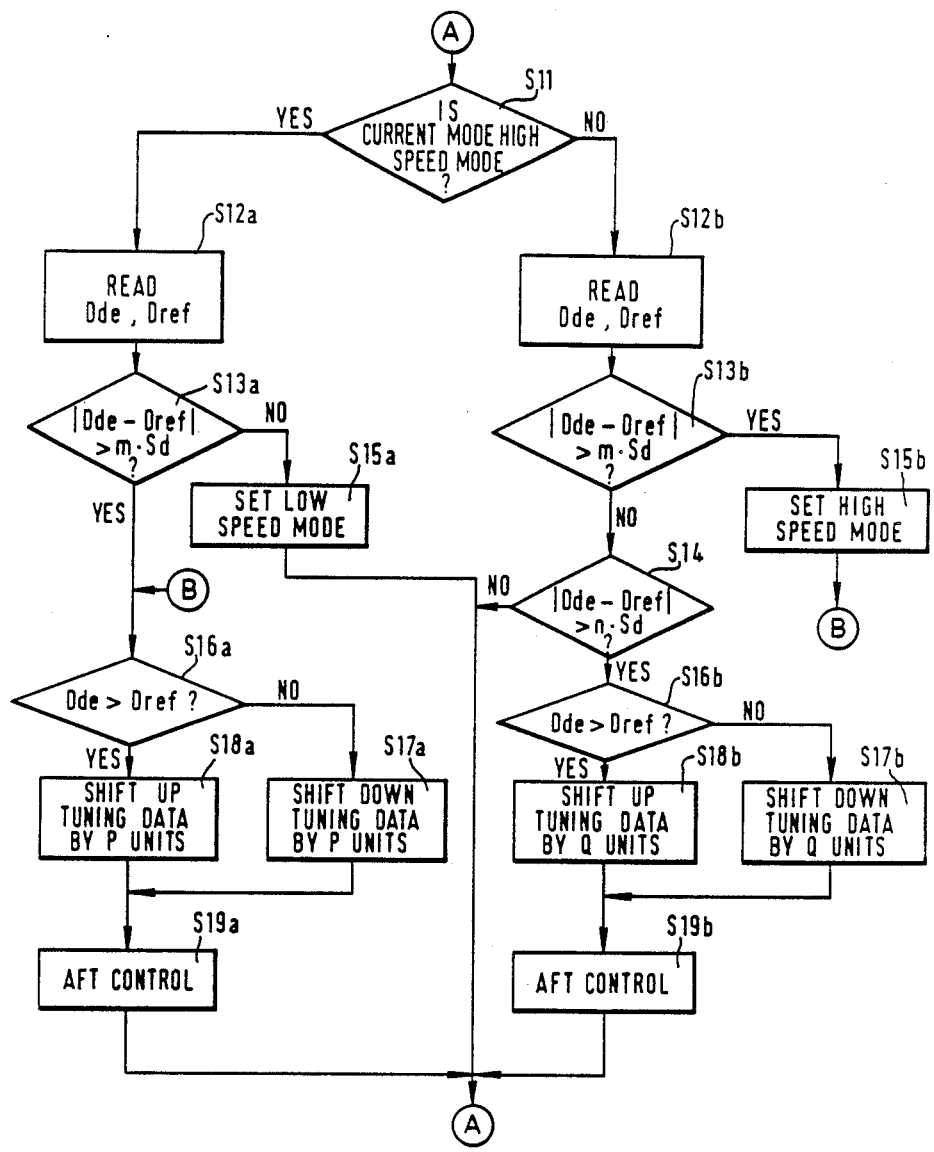
FIG. 7 is the flowchart showing AFT control operation by the present invention.

Referring now to FIGS. 5, 6 and 7, the calculation program to be executed by the microcomputer 48 in FIG. 4 will be described in detail later.

FIG. 5 shows a brief flowchart for illustrating an outline of operation executed by the automatic frequency control apparatus of an FM receiver according to the present invention. An initialization process such as the power ON routine is executed in Step S1. Then the process goes to Step S2. In Step S2, it is checked that whether a channel tuning operation has been executed or not. The channel tuning operation has been executed, the process goes to Step S3 through the branch "YES". In Step S3, calculation of the demodulation sensibility Sd is executed based on both the digital signals Dde and Dref from the first and second A/D converters 68 and 72.

When the calculation of the demodulation sensibility Sd is executed, the process goes to Step S5 through Step S4. In Step S4, a prescribed speed mode, e.g., a high speed mode is set for executing the AFT control. In Step S5, the AFT control of the second IF signal is executed, based on the demodulation sensibility Sd obtained in Step S3. The AFT control process comprises a sub-process of setting a proper dead zone fitted to the demodulation sensibility Sd calculated in Step S3, a sub-process of calculating a detuning degree, and a sub-process of setting a proper data scale to the AFT data signal Daft to be superposed on the channel tuning data.

If the channel tuning operation is not executed in Step S2, the process jumps to Step S5 through the branch "NO" of Step S2. Thus, the AFT control of the second IF signal is executed immediately. Step S5 is repeatedly executed regardless of the channel tuning operation and the second IF signal of the current channel is pulled toward its center frequency.

Referring now to FIG. 6, the detail of the process involved in Step S3 will be described. FIG. 6 is a flowchart showing the calculation process of the demodulation sensibility Sd.

Demodulation sensibility Sd can be calculated through shifting a current channel tuning data by a prescribed amount of data shift (referred to as "data shift unit" hereinafter). Then a difference between two demodulation errors Dde1 and Dde2 obtained from the current channel tuning data and the shifted channel tuning data is divided by a frequency change corresponding to the data shift unit.

That is, tuning of a prescribed channel is executed in Step S31. Then, the process goes to Step S32. In Step S32, the AFT control is put into the OFF mode. What is necessary to put the AFT control in the OFF mode is, for instance, to prevent the AFT data signal Daft from superposing over the channel tuning data. The digital data Dde1 corresponding to the demodulation error voltage Vde1 is read in Step S33.

When the digital data Dde1 corresponding to the the demodulation error voltage Vde1 based on the first tuning channel is obtained, the channel tuning data is shifted by N units (N is an integer) of prescribed minimum frequency change in the frequency division in Step S34. Now, assuming that one unit of the minimum frequency change corresponds to a frequency change at a frequency division according to a dividing ratio K (K is a positive real number), the local oscillation signal Fvco after shifting by N units of the minimum frequency changes increases or decreases by K.N Hz. Then, in Step S35, the digital data Dde2 corresponding to the demodulation error voltage Vde2, after shifting by N units of the minimum frequency changes steps, is read. Step S36 is the process of calculating the demodulation sensibility Sd from the digital data Dde1 and Dde2 corresponding to the demodulation error voltage Vaft1 and Vaft2 obtained in Steps S33 and S35.

The calculation in Step S36 is expressed as follows:

$$Sd = \frac{Dde2 - Dde1}{K \cdot N} \qquad (1)$$

Then, the process to decide a dead zone width based on the demodulation sensitivity Sd obtained by the calculation, the calculation of the detuning degree, and the execution of the AFT control of the second local oscillator 24 is explained in reference to FIG. 7.

The flowchart of FIG. 7 shows the process to control the AFT data signal Daft according to the demodulation sensitivity Sd obtained by the calculation shown in FIG. 6 for two modes of calculation speeds. In this case, the control with a unit of large frequency change is executed by a prescribed speed mode and the other control with the other unit of small frequency change is executed at a low speed mode.

In Step S11, it is judged whether the current mode when calculation of the demodulation sensitivity Sd ends is the high speed mode or the low speed mode. Here, as the current mode was set into the prescribed speed mode, e.g., the high speed mode as set in Step S4 (see FIG. 5) the judgement in Step S11 is "YES". Thus, the process goes to Step S12a.

In Step S12a, the digital data Dde corresponding to the demodulation error voltage Vde obtained from the second IF signal of the current channel and the digital data Dref corresponding to the reference voltage Vref are read. Thereafter, the process goes to Step S13a. In Step S13a, it is judged whether the following expression is satisfied or not, among the demodulation sensibility Sd, the digital data Dde and Dref corresponding to the demodulation error voltage Vde and the reference voltage Vref.

$$|Dde - Dref| > m \cdot Sd \qquad \ldots (2)$$

This judges a detuning degree at the time of current channel tuning. In the above expression (2), m is a prescribed coefficient for compensating the demodulation sensibility Sd. The coefficient m is fixed at a certain value. When it is assumed that the coefficient m is larger than one, the magnified demodulation sensibility m·Sd is compared with the digital data Dde and Dref corresponding to the demodulation error voltage Vde and the reference voltage Vref. This is to apparently magnify the data range of the dead zone.

If the digital data Dde corresponding to the demodulation error voltage Vde is sufficiently different from the digital Dref corresponding to the reference voltage Vref, the equation (2) is satisfied. Then, the process goes to Step S16a through the branch "YES" of Step S13a. The case indicates that the detuning degree is large.

In Step S16a, it is judged whether the digital data Dde corresponding to the demodulation error voltage Vde of the current channel is higher than the voltage range of the dead zone or not. If the digital data Dde corresponding to the demodulation error voltage Vde is higher than the voltage range of the dead zone, the process goes to Step S18a through the branch "YES" of Step S16a. In Step S18a, the channel tuning data is stepped up by P units of the minimum frequency change. If the digital data Dde corresponding to the demodulation error voltage Vde is lower than the voltage range of the dead zone, the process goes to Step S17a through the branch "NO" of Step S16a. In Step S17a, the channel tuning data is stepped down by P units of the minimum frequency change.

After Step S18a or S17a, the process goes to Step S19a. In Step S19a a new frequency division ratio is set in the frequency divider 32 of the second local oscillator 24 according to the channel tuning data obtained in Step S18a or S17a.

Now the other case that the digital data Dde corresponding to the demodulation error voltage Vde is lower than the voltage range of the dead zone will be described. This case indicates that the detuning degree is small. In this case, the equation (2) is not satisfied. Thus, the process goes to Step S15a through the branch "NO" of Step S13a. In Step S15a, the calculation speed mode of the AFT data signal Daft is changed to the low speed mode. Then the process goes back to the Step S11. In Step S11, it is again judged whether the current mode when calculation of the demodulation sensibility Sd ends is the high speed mode or the low speed mode. Here, as the current mode was set into the low speed mode in step S15a, the judgement in Step S11 is "NO". Thus, the process goes to Steps S12b and S13b.

In these Steps S12b and S13b, processes identical with those in Steps S12a and S13a are executed. When the digital data Dde corresponding to the demodulation error voltage Vde is smaller than the compensated demodulation sensibility m·Sd, the equation (2) is not satisfied. Then, the process goes to Step S14 through the branch "NO" of Step S13b. The case also indicates that the detuning degree is small.

In Step S14, it is judged whether the following expression is satisfied or not, among the demodulation sensibility Sd, the digital data Dde and Dref corresponding to the demodulation error voltage Vde and the reference voltage Vref.

$$|Dde - Dref| > n \cdot Sd \qquad \ldots (3)$$

This judges a detuning degree at the time of current channel tuning. In the above expression (3), n is another prescribed coefficient for compensating the demodulation sensibility Sd. The coefficient n is fixed at a certain value. When it is assumed that the coefficient n is smaller than one, the reduced demodulation sensibility n·Sd is compared with the digital data Dde and Dref corresponding to the demodulation error voltage Vde and the reference voltage Vref. This is to apparently reduce the voltage range of the dead zone.

If the demodulation error voltage Vde is larger than the compensated demodulation sensibility n·Sd, the equation (3) is satisfied. Then, the process goes to Step S16b through the branch "YES" of Step S14.

In Step S16b, it is judged whether the digital data Dde corresponding to the demodulation error voltage Vde of the current channel is higher than the voltage range of the dead zone or not. If the demodulation error voltage Vde is higher than the voltage range of the dead zone, the process goes to Step S18b through the branch "YES" of Step S16b. In Step S18b, the channel tuning data is stepped up by Q units of the minimum frequency change. If the digital data Dde corresponding to the demodulation error voltage Vde is lower than the voltage range of the dead zone, the process goes to Step S17b. In Step S17b, the channel tuning data is stepped down by Q units of the minimum frequency change.

Here the coefficient Q is smaller then the coefficient P (Q<P). That is, differing from the high speed mode, the channel tuning data is shifted by Q units, which is smaller than the shift of P units in the high speed mode.

After Step S18b or S17b, the process goes to Step S19b. In Step S19b, a new frequency division ratio is set in the frequency divider 32 of the second local oscillator 24 according to the channel tuning data obtained in Step S18b or S17b.

If the equation (3) is satisfied in Step S13b, the process goes to Step S15b through the branch "YES" of Step S13b. The case indicates that the detuning degree is large. In Step S15b, the calculation speed mode of the AFT data signal Daft is changed to the high speed mode. Then the process goes to Step S16a. Thus, the processes as described above in reference to Steps S16a, S18a (or S17a) and S19a are executed.

As described above, a proper amount of frequency changes in the AFT control is set by two speed modes according to the detuning degree in this embodiment. All standards at this time are decided by the demodulation sensibility Sd. All parameters are set at accurate numerical values proportional to the demodulation sensibility Sd according to the following conditions;

Threshold Value $m$ of Detuning Degree > Threshold Value $N$ of Dead Zone (4)

Units of Shifting in Low Speed Mode $Q$ < Units of Shifting in High Speed Mode $P$ (5)

Thus, AFT control with less malfunction corresponding to fluctuation in demodulation sensibility Sd becomes possible.

Further, high precision temperature compensation becomes possible by offsetting the temperature coefficient of the demodulation output by giving the temperature coefficient to the reference voltage Vref that is set at the reference voltage source 46a in the embodiment.

Further, when more than two threshold values of detuning degree are provided, it is possible to set a change step width between respective threshold values and more higher AFT control becomes possible.

Referring now to FIGS. 8 through 12, the data correction carried out by the microcomputer 48 during the transient state will be described in detail.

Figure 8:
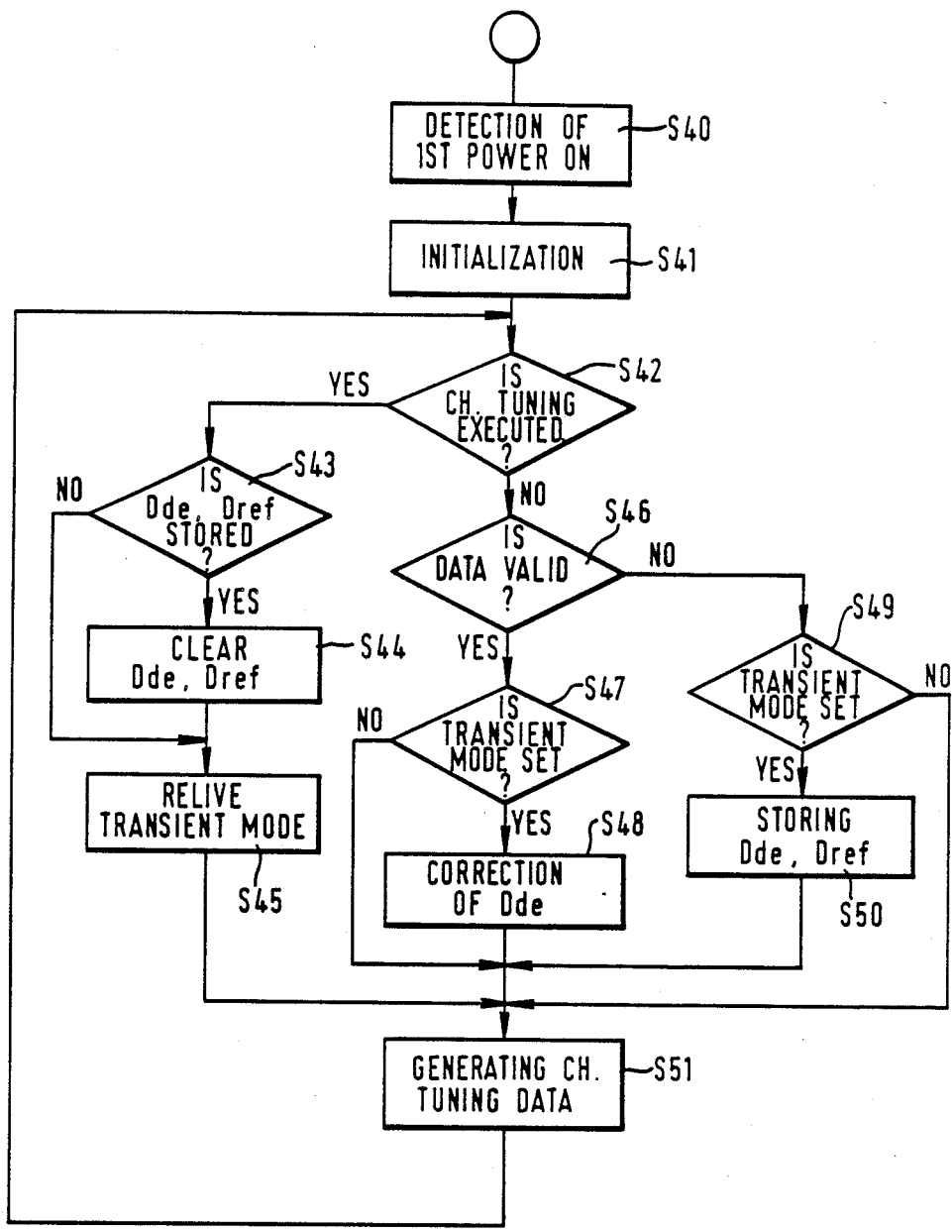
FIG. 8 is the flowchart showing the outline of the data correction carried out by the microcomputer 48 during the transient state.

FIG. 8 shows a flowchart for illustrating an outline of the data correction carried out by the microcomputer 48 during the transient state. In Step S40, a first turn ON operation of the power source is detected. Then, data previously stored in the memory provided in the initial data setting circuit 74 are cleared in Step S41. Further, the microcomputer 48 is prepared to a transient mode in Step S41. Then the process goes to Step S42. In Step S42, it is checked that whether a channel tuning operation has been executed or not. In case of "YES", i.e., when the channel tuning operation has been executed, the process goes to Step S43 through the branch "YES". In Step S43, it is checked that whether both the digital signals Dde and Dref from the first and second A/D converters 68 and 72 has been stored in the memory or not. In case of "YES", the process goes to Step S44. In Step S44, the digital signals Dde and Dref are cleared. Then, the process goes to Step S45. In case of "NO", the process also goes to Step S45. In Step S45, the transient mode is relieved so that the microcomputer 48 carries out necessary processing for the AFT operation.

In case of "YES" in step S42, i.e., when the channel tuning operation has not been executed, the process goes to Step S46 through the branch "NO". In Step S46, it is checked whether the digital signals Dde and Dref are valid or not. In case of "NO", the process goes to Step S49 through the branch "NO". In Step S49, it is checked whether the current mode is the transient mode or not. In case of "YES", the process goes to Step S50 through the branch "YES". In Step S50, the digital signals Dde and Dref are stored in the memory. In Case of "NO" in Step S49, the process goes to Step S51 through the branch "NO". In Step S51, the microcomputer 48 carries out necessary processing for the channel tuning operation. After that, the above-mentioned AFT operation is carried out.

In case of "YES" in Step S46, the process goes to Step S47 through the branch "YES". In Step S47, it is checked whether the current mode is the transient mode or not. In case of "YES", the process goes to Step S48 through the branch "YES". In Step S48, the digital signal Dde is corrected. The data correction is carried out by using corresponding data stored in the memory at a previous processing for the transient mode. In case of "NO" in Step S47, the process goes to Step S51. Thus, the processing for the channel tuning operation is carried out in Step S51.

According to the above process, the microcomputer 48 stores initial data of the digital signals Dde and Dref during a prescribed transient period when the SHF band FM receiver is firstly used. From the second usage of the SHF band FM receiver, the microcomputer 48 executes the transient mode for a prescribed period when the power source is turned ON. In the transient mode, the initial data of the digital signals Dde and Dref stored previously are used as the data valid for the transient state. Thus, the SHF band FM receiver can operate immediately at a stable state even in the transient state.

Figure 10:
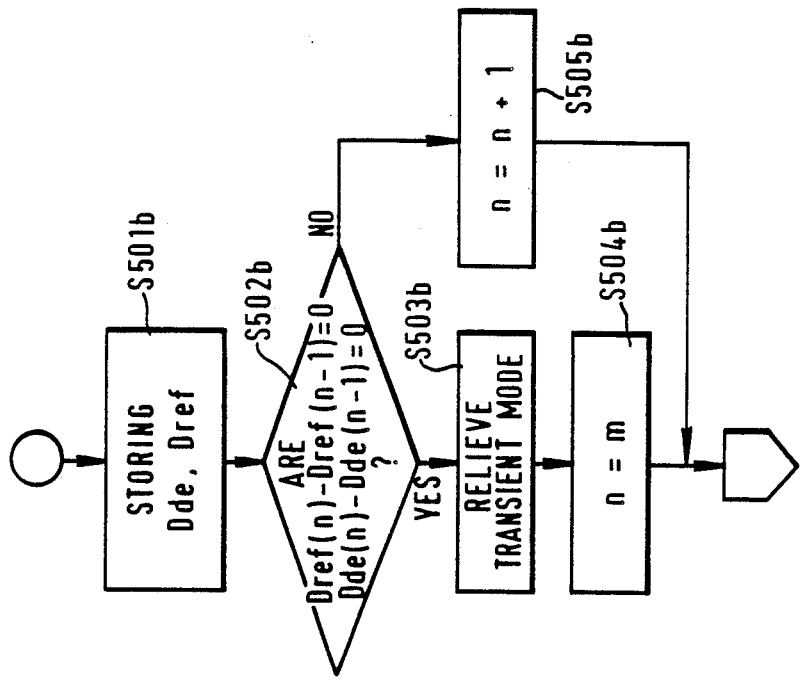
FIGS. 9 and 10 are the flowcharts showing the data storing operation carried out in Step S40 of FIG. 8.
Figure 9:
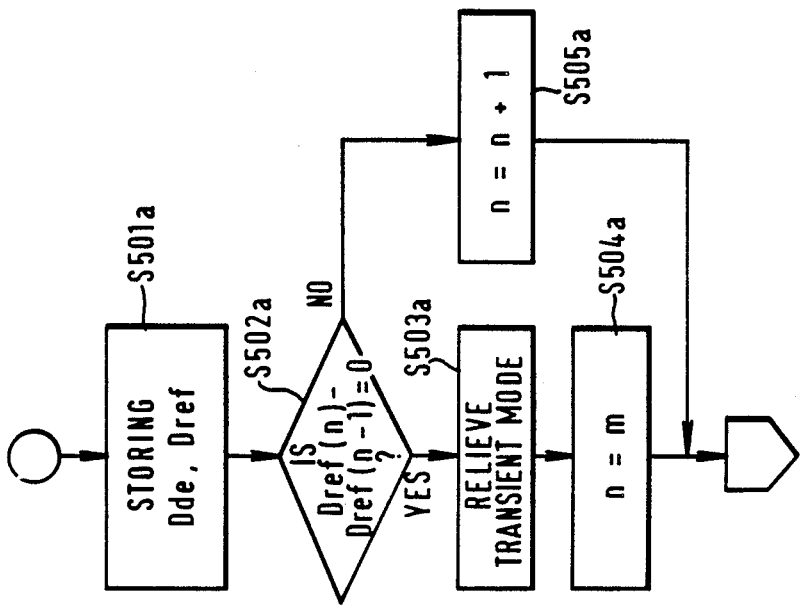

Referring now to FIGS. 9 and 10, the process carried out in Step S50 will be described in further detail. Both of FIGS. 9 and 10 show flowcharts for storing the initial data of the digital data Dde and Dref. In the processes, the microcomputer 48 stores the data for many times when individual data are varying. That is, the data storing operation is carried out for a prescribed times in the transient mode. The microcomputer 48 also checks the transient state according to whether the data are varying or not.

In FIG. 9, Step S501a shows a process for storing the digital data Dde and Dref corresponding to the voltage signals Vde and Vref supplied from the first and the second level shifters 66 and 70 (see FIG. 4). Then, the process goes to Step S502a. In Step S502a, the current data Dde(n) and Dref(n) at an "n"th order are compared with previous data Dde(n−1) and Dref(n−1) stored in previous order, i.e., "n−1"th order. During the data storing operation, the order "n" is counted by a suitable counter. The counter is typically set in the microcomputer 48.

The microcomputer 48 checks whether the following equation is satisfied or not.

$$Dref(n) - Dref(n-1) = 0 \quad \ldots (6)$$

If the above equation (6) is not satisfied, the process goes to Step S505a through branch "NO". In Step S505a, the order of the processing is stepped up by one. Thus, the data Dde(n) and Dref(n) are stored in the memory for every order of the count up. Now it is assumed that the data are stored as the initial data Dde-i(n) and Dref-i(n).

If the above equation (6) is satisfied in Step S502a, the process goes to Steps S503a and S504a in the order. In Step S503a, the transient mode is relieved. In Step S504a, a maximum count order "m" is set for defining the end of the transient period.

FIG. 10 shows another process of the data storing operation almost similar to the process of FIG. 9. In FIG. 10, Steps S501b, S503b, S504b and S505b are the same as Steps S501a, S503a, S504a and S505a in FIG. 9. But Step S502b is different from Step S502a. That is, the microcomputer 48 checks whether the following two equations are satisfied or not.

$$Dde(n) - Dde(n-1) = 0 \quad \ldots (7)$$

$$Dref(n) - Dref(n-1) = 0 \quad \ldots (8)$$

Thus, the process goes to Step S503b only when both of the above two equations (7) and (8) are simultaneously satisfied. Accordingly, the system due to FIG. 10 has a reliability hither than the system due to FIG. 9. The data Dde and Dref stored in the memory of the initial data setting circuit 74 are used as the initial data Dde-i and Dref-i.

Figure 12:
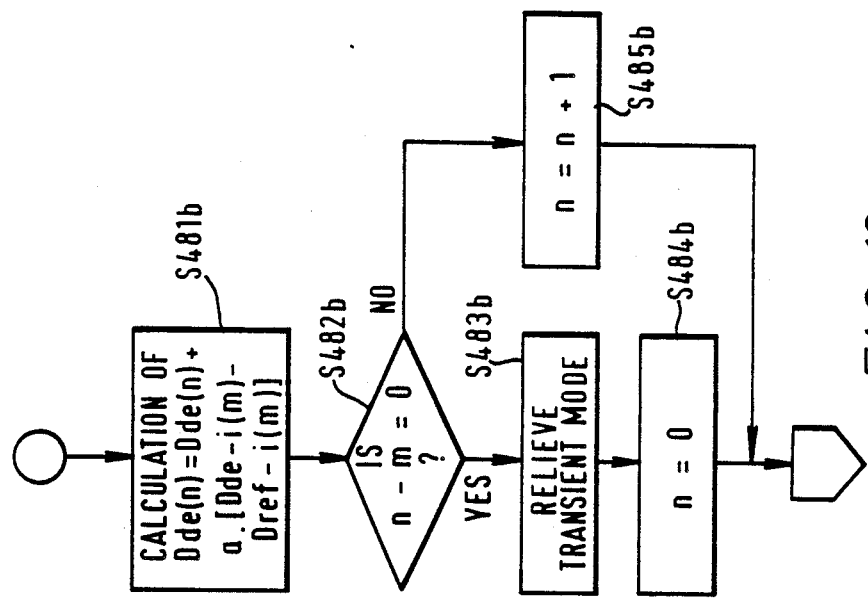
FIGS. 11 and 12 are the flowcharts showing the data corrections carried out in Step S38 of FIG. 8.
Figure 11:
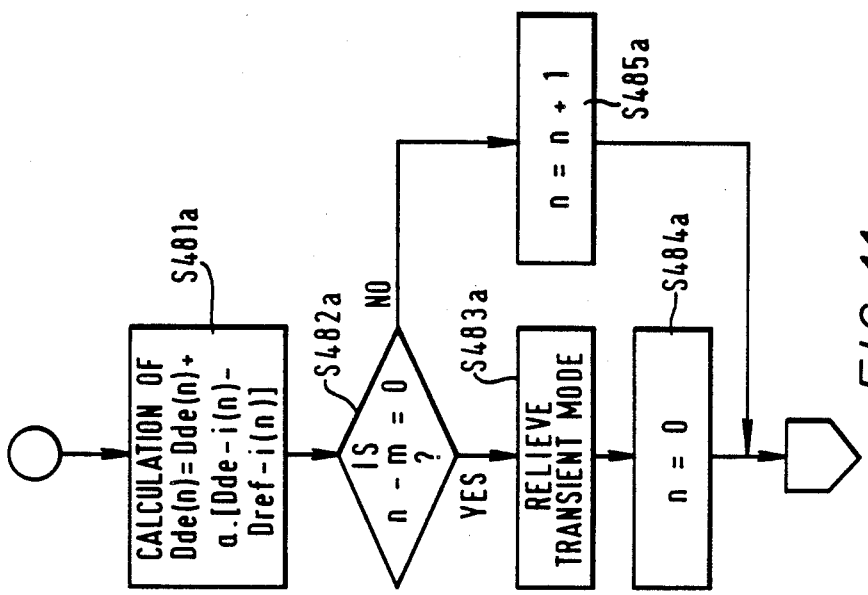

Referring now to FIGS. 11 and 12, the process carried out in Step S48 of FIG. 8 will be described in further detail. Both of FIGS. 11 and 12 show flowcharts for correcting the digital data Dde in the transient mode. In the processes, the microcomputer 48 corrects current data Dde for many times corresponding to the data storing operations carried out in the first turn ON operation of the apparatus. Further, the data corrections are carried out after the data storing operation by Step S50 in FIG. 8, i.e., the operation in FIG. 9 or 10 has been completed. Thus, the data corrections are curried out when the validity of the initial data Di has been established.

In FIG. 11, Step S481a shows a process for correcting current digital data Dde during the transient mode after the power source has been turned ON. The data correction is carried out by using the initial data Di stored in the memory of the initial data setting circuit 74. The data corrections are carried out under the control of the count data "n" counted by the counter as described above. Thus, the data corrections in Step S48 are carried out at the periods from the turn ON operation of the power source the same as those at the process in Step S50.

In Step S481a, a following calculation is carried out;

$$Dde(n) = Dde(n) + \alpha \cdot [Dde-i(n) - Dref-i(n)] \quad \ldots (9)$$

wherein Dde(n) in the left side is a corrected data, Dde(n) in the right side is a current data supplied from the first A/D converter 68, and $\alpha$ is a compensation factor.

The process then goes to Step S482a. In Step S482a, it is checked whether the count order "n" agrees with the maximum count order "m" or not. That is, the microcomputer 48 checks whether a following equation is sarisfied or not.

$$n - m = 0 \quad \ldots (10)$$

If the above equation (10) is not satisfied, the process goes to Step S485a through branch "NO". In Step S485s, the order of the processing is stepped up by one. Thus, the current data Dde(n) are corrected for every order of the count up.

If the above equation (10) is satisfied in Step S485a, the process goes to Steps S483a and S484a in the order. In Step S483a, the transient mode is relieved. In Step S484a, the count data "n" is cleared (n=0) for completing the process of the data correction in the transient mode.

FIG. 12 shows another process of the data correction almost similar to the process of FIG. 11. In FIG. 12, Steps S482b, S483b, S484b and S485b are the same as Steps S482a, S483a, S484a and S485a in FIG. 11. But Step S481b is different from Step S481a. That is, in Step S481b, a following calculation is carried out;

$$Dde(n) = Dde(n) + \alpha \cdot [Dde-i(m) - Dref-i(m)] \quad \ldots (11)$$

According to the equation (11), current data Dde(n) is corrected by a fixed amount of correction data, i.e., $\alpha \cdot [Dde-i(m) - Dref-i(m)]$. The data $Dde-i(m)$ and $Dref-i(m)$ correspond to the data stored when the transient state has passes over and the operation of the apparatus has been stabilized. The data correction according to FIG. 12 is less accurate than that of FIG. 11, but it is very simple. The data correction according to FIG. 12 is advantageous for typical FM radio receivers.

Figure 14:
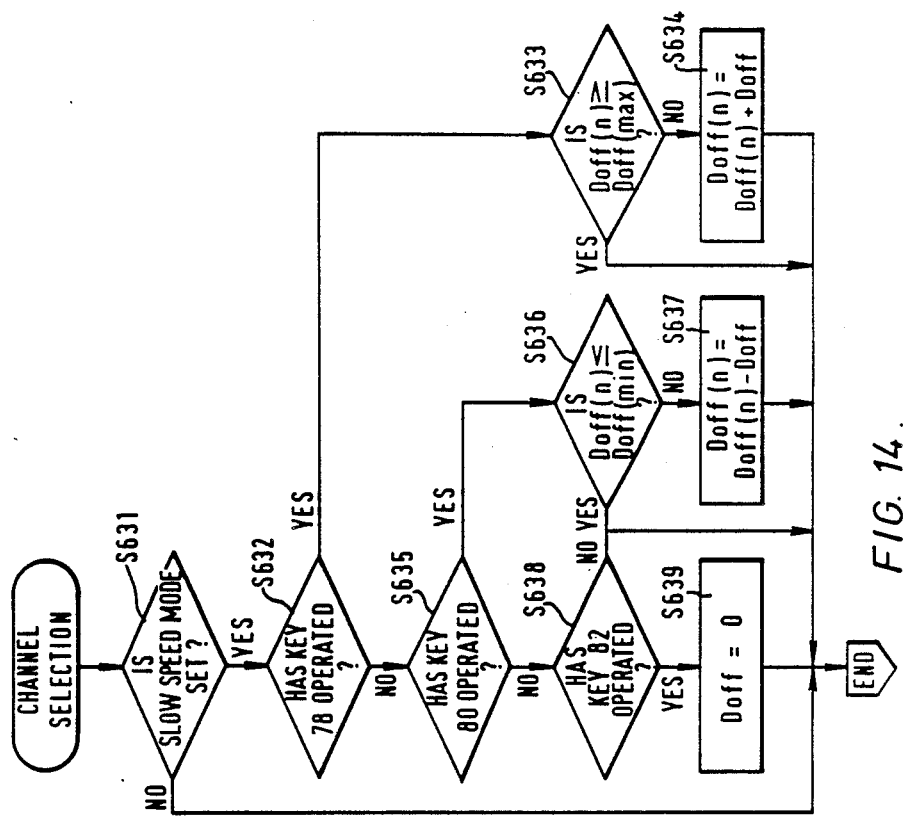
FIG. 14 is the flowchart showing the frequency offsetting operation carried out in Step S53 of FIG. 13.
Figure 13:
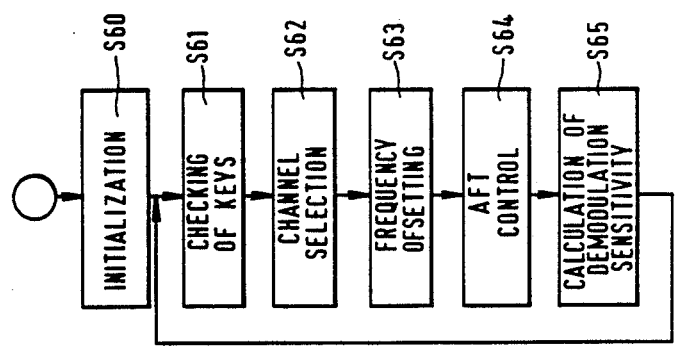
FIG. 13 is a flowchart showing the outline of operation carried out by the microcomputer 48 for offsetting the center frequency of the second IF signal.

Referring now to FIGS. 13 and 14, the intentional offsetting operation of the center frequency of the second IF signal will be described in detail.

FIG. 13 shows a brief flowchart for illustrating an outline of operation carried out by the microcomputer 48. In Step S60, the microcomputer 48 is prepared for operation in response to a turn ON operation of the power source. In Step S61, the microcomputer 48 checks the keyboard 76 and the set of the frequency offset keys 78, 80 and 82. Thus, in Step S62, a desired channel data designated through the keyboard 76 by user is applied to the frequency divider 32 in the second local oscillator 24 (see FIG. 4) from the microcomputer 48. Further, in Step S63, the center frequency of the second IF signal is offset in response to the operation states of the frequency offset keys 78, 80 and 82. Now it is assumed that the first key 78 is designated for offsetting the center frequency upward. It is assumed that the second key 80 is designated for offsetting the center frequency downward. Also it is assumed that the third key 82 is designated for resetting an offset frequency to the original center frequency. The process in Step S63 will be described in detail later. Then, the process goes to Steps S64 and S65. In Step S64, the AFT control of the second local oscillator 24 is executed as like the above-mentioned in reference to FIG. 7. In Step S65, the demodulation sensibility Sd is calculated as like the above-mentioned in reference to FIG. 6.

Referring now to FIG. 14, the frequency offsetting operation carried out in Step S63 will be described in detail. FIG. 14 shows a flowchart for illustrating an outline of the frequency offsetting operation. In Step S631, the speed of the AFT operation is checked. If the AFT operation is in the high speed mode, the process goes to Step END through the branch "NO". Thus, the frequency offsetting operation is interfered. This is because the frequency offsetting operation during the high speed mode is apt to commit error.

If the AFT operation is in the slow speed mode, the process goes to Step S632 through the branch "YES". In Step S632, it is checked whether the first key 78 has been operated or not. If the first key 78 has been operated, the process goes to Step S633 through the branch "YES". In Step S633, a current offset data Doff(n) is compared with a prescribed maximum offset data Doff-(max). This prescribed maximum offset data Doff(m) is set in the microcomputer 78. If the current offset data Doff(n) is equal to or larger than the prescribed maximum offset data Doff(max), the process goes to Step END through the branch "YES". Thus, the operation for offsetting upward the center frequency is completed. If the current offset data Doff(n) is smaller than the prescribed maximum offset data Doff(max), the process goes to Step S634 through the branch "NO". In Step S634, the offset data Doff(n) is increased by a unit value Doff. In other wards, a following calculation is carried out in Step S634.

$$Doff(n) = Doff(n) + Doff \qquad \ldots (12)$$

If the first key 78 has not been operated in Step S632, the process goes to Step S635 through the branch "YES". In Step S635, it is checked whether the second key 80 has been operated or not. If the second key 80 has been operated, the process goes to Step S636 through the branch "YES". In Step S636, a current offset data Doff(n) is compared with a prescribed minimum offset data Doff(min). This prescribed minimum offset data Doff(min) is also set in the microcomputer 78. If the current offset data Doff(n) is equal to or smaller than the prescribed minimum offset data Doff(min), the process goes to Step END through the branch "YES". Thus, the operation for offsetting downward the center frequency is completed. If the current offset data Doff(n) is larger than the prescribed minimum offset data Doff(min), the process goes to Step S637 through the branch "NO". In Step S637, the offset data Doff(n) is decreased by the unit value Doff. In other wards, a following calculation is carried out in Step S637.

$$Doff(n) = Doff(n) - Doff \qquad \ldots (13)$$

If the second key 80 has not been operated in Step S635, the process goes to Step S638 through the branch "NO". In Step S638, it is checked whether the third key 82 has been operated or not. If the third key 82 has not been operated, the process goes to Step END through the branch "NO". If the third key 82 has been operated, the process goes to Step S639 through the branch "YES". In Step S639, the offset data Doff(n) is cleared. Thus, the center frequency without offset is recovered.

The third key 82 is useful not only for recovering the center frequency but also for a provisional operation to another frequency offsetting operation by the first or second key 78, 80. The third key 82 for reset operation can be removed if any display device for indicating the offset frequency is provided.

As described above, the present invention can provide an extremely preferable automatic frequency control apparatus for FM receivers.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. An automatic frequency control apparatus for an FM receiver, comprising:
    oscillation means for generating a frequency controlled oscillation output in response to a received input FM signal;
    frequency conversion means for converting the input FM signal into an IF signal having a center frequency in response to the oscillation output from the oscillation means;
    demodulation means for demodulating the IF signal into a demodulated output having AC and DC compoments;
    low pass filter means for removing the AC component from the demodulated output;
    first A/D converter means for converting the remaining DC component of the demodulated output to a digital tuning signal;
    voltage generating means for outputting a reference voltage corresponding to the center frequency of the IF signal;
    second A/D converter means for converting the reference voltage from the voltage generating means to a digital reference voltage signal;
    calculating means for calculating the demodulation sensibility of the digital tuning signal from the digital tuning signal and the digital reference voltage signal and for generating an AFT data signal in response to the demodulation sensibility of the digital tuning signal for controlling the frequency of the oscillation means.

2. The apparatus of claim 1 wherein the first and second A/D converter means each includes a level shift means.

3. The apparatus of claim 1 wherein the oscillation means includes a frequency divider.

4. The apparatus of claim 1 wherein the calculating means includes a microcomputer.

* * * * *